(12) United States Patent
Liu et al.

(10) Patent No.: US 6,380,078 B1
(45) Date of Patent: Apr. 30, 2002

(54) METHOD FOR FABRICATION OF DAMASCENE INTERCONNECTS AND RELATED STRUCTURES

(75) Inventors: Q. Z. Liu, Irvine; Lawrence E. Camilletti, Foothill Ranch, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/569,890

(22) Filed: May 11, 2000

(51) Int. Cl.[7] ........................................... H01L 21/4763

(52) U.S. Cl. ...................... 438/638; 438/692; 438/713; 438/734; 216/65; 216/66; 216/67

(58) Field of Search ................................. 438/638, 692, 438/713, 734, 745; 216/38, 88, 65, 66, 67

(56) References Cited

U.S. PATENT DOCUMENTS 6,117,782 A * 9/2000 Lukanc et al. .............. 438/692

* cited by examiner

Primary Examiner—David Nelms
Assistant Examiner—Renée R. Berry
(74) Attorney, Agent, or Firm—Farjami & Farjami LLP

(57) ABSTRACT

Method for fabrication of damascene interconnects and related structures is disclosed. A sacrificial layer is formed over a low-k dielectric. Trenches are then etched inside the sacrificial layer and the low-k dielectric. The trenches are then filled with metal. During a first CMP process, excess metal over the sacrificial layer is removed. During a second CMP process, the sacrificial layer over the low-k dielectric and any remaining excess metal are removed. By the end of the second CMP process substantially all of the sacrificial layer and all of the excess metal are removed. In this manner, the trenches in the low-k dielectric are filled with metal where the metal surface is substantially flush with the surface of the low-k dielectric.

11 Claims, 3 Drawing Sheets

US 6,380,078 B1

METHOD FOR FABRICATION OF DAMASCENE INTERCONNECTS AND RELATED STRUCTURES

BACKGROUND OF THE INVENTION

1. Field of the Invention

The present invention is in the field of integrated circuit fabrication. More particularly, the invention is in the field of fabrication of damascene interconnects for integrated circuits using copper and low dielectric constant materials.

2. Background Art

The drive to fabricate faster IC (Integrated Circuit) chips is in large part focused on improving the speed of the IC chip interconnect while maintaining or improving other aspects of IC chip performance such as low noise and long term reliability. Interconnect delay is directly proportional to the product of interconnect resistance and the capacitance driven by the interconnect. Thus, in order to improve the speed of the IC chip interconnect, there is need to the reduce the resistivity and the capacitance of the IC chip interconnect. The capacitance of the interconnect is directly proportional to the dielectric constant ("k") of the dielectric that insulates the interconnect from other interconnect or other circuits of the IC chip. As such, reducing the dielectric constant of the dielectric results in a reduction of the interconnect capacitance and a reduction in the interconnect delay.

Traditionally, aluminum has been used as the primary interconnect conductor and silicon oxide has been used as the primary dielectric in IC chips. Recently, copper has become more desirable as an interconnect conductor at least partly due to the fact that copper has lower resistivity than aluminum. Also recently, a number of low dielectric constant ("low-k") materials having dielectric constants below that of silicon oxide have been used in IC chips (silicon oxide has a dielectric constant of approximately 4.0). However, the use of copper and low-k dielectric materials has introduced a number of challenges in manufacturing IC chips.

For example, it is difficult to etch copper and as such the "subtractive etch" process used to etch aluminum cannot be successfully used in copper chips. Thus, the present approach to patterning copper interconnect is based on "damascene" processing. The term "damascene" is derived from the ancient in-laid metal artistry originated in Damascus. According to the damascene process, a trench or canal is cut into the dielectric and then filled with metal. FIGS. 1A through 1D help describe an overview of the damascene process used to fabricate copper interconnect.

Referring to FIG. 1A, insulating layer 102 (for example, silicon oxide) is formed on a substrate 104, which usually contains circuitry and may contain other interconnection levels. To help with the patterning of copper by the damascene process, layer 102 should have a uniform thickness and be as flat as possible. An ideally flat insulating layer 102 is shown in FIG. 1A.

FIG. 1B shows a cross-section of layer 102 after patterning to create two trenches, wide trench 106 and narrow trench 108. These trenches are formed by removing a top portion of layer 102 using photolithography and a suitable anisotropic etch technique, such as reactive ion etching, which are known in the art. These trenches are where copper interconnect conductors should be laid in. Moreover, the part of layer 102 which is situated between wide trench 106 and narrow trench 108 provides insulation between the copper interconnect to be laid in trench 106 and the copper interconnect to be laid in trench 108. This part of layer 102 is referred to by numeral 107. Referring to FIG. 1C, copper film 112 is shown as having been deposited over insulating layer 102. Although not shown in any of the FIGURES, prior to deposition of copper film 112, a metal barrier layer such as tantalum (Ta) or tantalum nitride (TaN) is deposited over insulating layer 102. Further, a physical vapor deposition (PVD) copper seed layer (not shown in any of the FIGURES) may also be deposited. Copper film 112 may, for example, be formed by chemical vapor deposition (CVD), PVD, PVD followed by reflow, or electroplating. Preferably, copper film 112 is deposited to a depth such that trenches 106 and 108 are completely filled with copper. Manifestly, the unwanted portions of copper film 112, for example the portion that is shown as covering part 107 of layer 102, must be removed.

FIG. 1D shows a wide inlaid copper conductor 114 and a narrow inlaid copper interconnect 116 remaining in trenches 106 and 108, respectively, after polishing to remove the unwanted portions of copper film 112. Polishing is preferably accomplished by chemical-mechanical polishing ("CMP"), wherein the semiconductor wafer and/or a polishing pad are rotatably mounted and brought into contact with each other under rotation. A slurry providing both abrasive and chemically reactive components is supplied, typically to the pad, during polishing. The abrasive component is typically comprised of finely ground colloidal silica or alumina particles. The chemically reactive component is typically diluted acid and/or hydrogen peroxide, with the remainder of the slurry comprised of deionized water. In general, it is desirable that the slurry composition and polishing conditions (e.g. rotational velocity, polish force, temperature) be adjusted such that the conducting films (i.e. the deposited copper film and the metal barrier layer) are selectively removed at a faster rate than the insulating layer (30:1 being a typical ratio) during the CMP.

One drawback of the CMP process, however, is illustrated in FIG. 1D. The top surface of narrow copper interconnect 116 is shown as slightly "dished" but substantially co-planar with the upper surface of insulating layer 102. However, wide copper interconnect 114 is shown as severely dished. This effect is referred to as "dishing" in the present application. The dishing phenomenon, such as that shown in wide interconnect 114, results in an uneven profile in the interconnect layer which, among other things, is harmful to the fabrication process of subsequent layers in the IC chip. In extreme cases, sections of a wide conductor, such as wide conductor 114, may be completely removed from the trench during polishing, leaving the trench bottom exposed. This total absence of any metal at the central parts of a wide metal conductor is undesirable since, for example, it causes an increase in the resistance of the metal interconnect and also reduces the long term reliability of the IC chip.

In addition to the harmful effects on the fabrication process of subsequent layers in the IC chip, dishing detrimentally affects electrical performance characteristics of the copper interconnects. Copper dishing results in a non-uniform thickness of copper interconnects. As a result of this non-uniform thickness of the copper interconnects the electrical performance characteristics are negatively affected. For example, the resistivity of a copper interconnect is a function of its thickness and as such, the resistivity of a copper interconnect is negatively affected due to non-uniform thickness of the copper interconnect. As another example, the amount of current that a copper interconnect can conduct is dependent on the thickness of the interconnect. A lower thickness results in a more pronounced electromigration problem when high currents are passed through the interconnect. Electromigration results in a loss of metal at certain points in the interconnect which would then result in a reliability problem. Thus, a non-uniform thickness in the copper interconnect may decrease electromigration performance and cause reliability problems.

Another drawback of the CMP process is also illustrated in FIG. 1D. The sharp edges of insulating layer 102 at the top of the walls in wide trench 106 and narrow trench 108 shown in FIG. 1C have been rounded by the CMP process. An example of such rounding effect is pointed to by numeral 115 in FIG. 1D. This rounding of the sharp edges of insulating layer 102 at the top of the trench walls and subsequent loss of oxide thickness in dense narrow trench arrays (not shown in FIG. 1D) is referred to in the present application as "dielectric erosion." Dielectric erosion is harmful to the integrity of the IC chip and negatively affects the fabrication process of subsequent layers in the IC chip.

One method known in the art to reduce copper dishing and dielectric erosion involves a two-step or a multi-step copper CMP process. In the first step, the unwanted portions of the copper situated above the dielectric are removed using CMP slurry chemistries and process parameters designed to quickly remove copper. In the second step, the slurry chemistries and parameters are chosen such that the removal rate for copper and the oxide dielectric surrounding the copper are about equal and a specific amount of oxide is removed for a given time period. As explained in a paper entitled "Planarization of Dual-Damascene Post-Metal-CMP Structures" by Chenting Lin, Larry Clevenger, Florian Schnabel, Fen Jamin, and David Dobuzinski published in the Proceedings of the 1999 International Interconnect Technology Conference, page 87, May 1999, this second step aims to planarize the overall surface of the wafer, reducing the effects of copper dishing and dielectric erosion. However, according to this known method, it is difficult to remove the exact required quantities of dielectric to accomplish the desired planarization.

U.S. Pat. No. 5,578,523 entitled "Method for forming inlaid interconnects in a semiconductor device" discloses a method for forming an inlaid interconnect by chemical mechanical polishing. A polish assisting layer is formed between an interlayer dielectric and an interconnect metal. The polish assisting layer is removed at approximately the same rate as the interconnect metal during the final stages of polishing and therefore dishing is avoided.

U.S. Pat. No. 5,534,462 entitled "Method For Forming A Plug And Semiconductor Device Having The Same" discloses a method for forming a plug in a semiconductor device. An aluminum nitride glue layer is deposited on an interlayer dielectric. A contact opening is then formed. Tungsten or other plug material is then deposited in the opening and on the glue layer and afterward polished or etched back to form the plug.

U.S. Pat. No. 5,064,683 entitled "Method For Polish Planarizing A Semiconductor Substrate By Using A Boron Nitride Polish Stop" discloses a polish planarization method using a boron nitride polish stop layer. The stop layer is deposited over a substrate. A dielectric or conductive material is deposited over the stop layer and the recessed regions of the substrate. The dielectric or conductive material is then polished back until the stop layer is reached.

U.S. Pat. No. 4,789,648 entitled "Method For Producing Coplanar Multi-Level Metal/Insulator Films On A Substrate And For Forming Patterned Conductive Lines Simultaneously With Stud Vias" discloses a method for forming multiple levels of patterned conductive lines connected by stud vias through insulation layers. As part of the fabrication process an etch stop material is used to assist in defining desired wiring channels.

U.S. Pat. No. 4,936,950 entitled "Method Of Forming A Configuration Of Interconnections On A Semiconductor Device Having A High Integration Density" discloses a method for forming multi-level interconnects using conductive contact studs. The layers of interconnect are separated by isolating layers. As part of this process, a separation layer is used which can be selectively removed with respect to the isolation layers.

U.S. Pat. No. 5,225,372 entitled "Method Of Making A Semiconductor Device Having An Improved Metallization Structure" discloses a method for fabricating semiconductor device interconnects that uses a conductive layer with an underlying diffusion barrier metal attached to a doped glass layer by an intermediate metal adhesion layer.

U.S. Pat. No. 5,272,117 entitled "Method For Planarizing A Layer Of Material" discloses a method for forming a planarized layer of material using an etch stop layer to accurately determine the thickness of the planarized layer.

The above-discussed paper and patents have not overcome a number of problems inherent in the CMP process. Some of the methods described above are not specifically directed to counteracting copper dishing and dielectric erosion. Other methods avoid copper dishing, but leave remnants of the stop layer behind after the mechanical polish is completed. This residual stop layer usually has a higher dielectric constant than the interlayer dielectric, thus increasing the overall capacitance, and as such this residual stop layer is undesirable.

From the above discussion of the background art it is apparent that there is serious need in the art for a method for fabrication of copper interconnects that counteracts the undesirable copper dishing and dielectric erosion effects that are a result of the copper CMP process and at the same time leaves no residual stop layer behind.

SUMMARY OF THE INVENTION

The present invention is method for fabrication of damascene interconnects and related structures. The invention counteracts undesirable copper dishing and dielectric erosion effects which would otherwise result from the copper CMP process.

According to the invention, a sacrificial layer is formed over a low-k dielectric. Trenches are then etched inside the sacrificial layer and the low-k dielectric. The trenches are then filled with metal. During a first CMP process, excess metal over the sacrificial layer is removed. During a second CMP process, the sacrificial layer over the low-k dielectric and any remaining excess metal are removed. By the end of the second CMP process substantially all of the sacrificial layer and all of the excess metal are removed. In this manner, the trenches in the low-k dielectric are filled with metal where the metal surface is substantially flush with the surface of the low-k dielectric.

DETAILED DESCRIPTION OF THE INVENTION

The present invention is method for fabrication of damascene interconnects and related structures. The following description contains specific information pertaining to different types of materials, layouts, dimensions, and implementations of the invention's method. One skilled in the art will recognize that the present invention may be practiced with material, layouts, dimensions, and implementations different from those specifically discussed in the present application. Moreover, some of the specific details of the invention are not discussed in order to not obscure the invention. The specific details not discussed in the present application are within the knowledge of a person of ordinary skills in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1A:
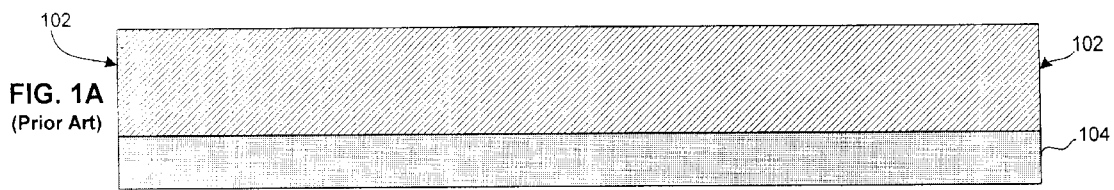
FIGS. 1A through 1D show an overview of conventional damascene and CMP processes.
Figure 1B:
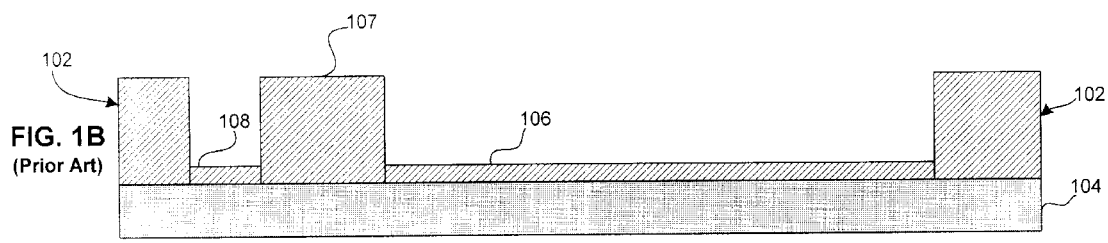
Figure 1C:
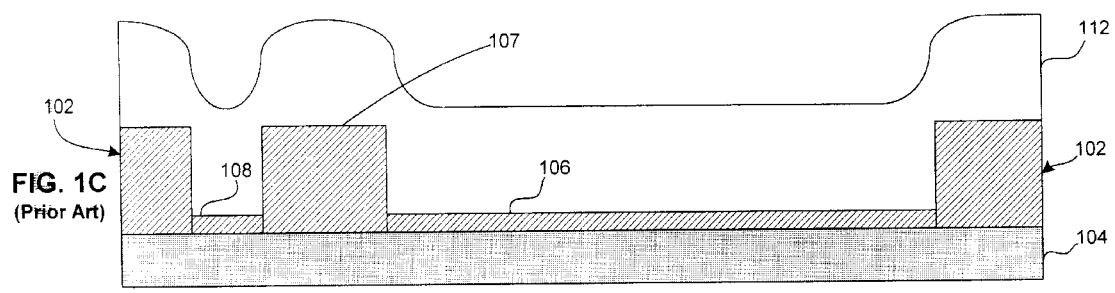
Figure 1D:
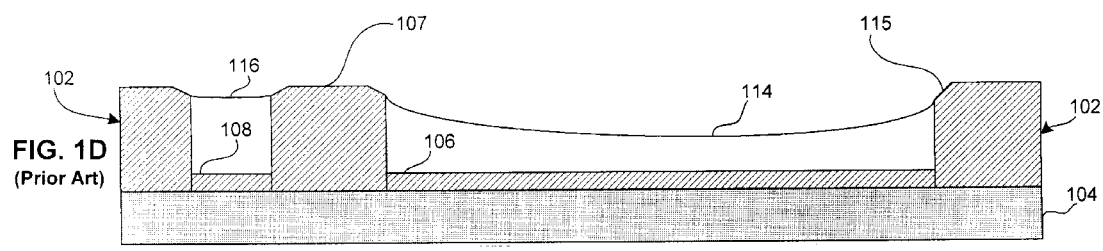
Figure 2A:
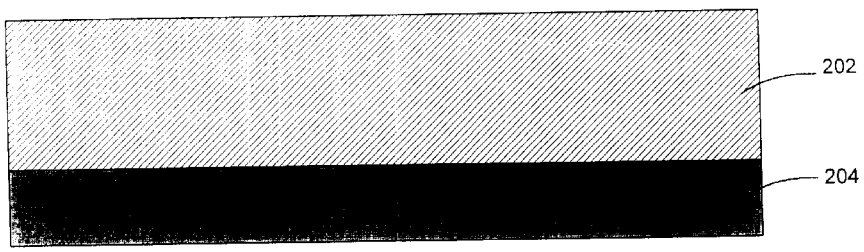
FIG. 2A shows a cross-section of a low-k dielectric material resting on a substrate.

One embodiment of the invention's method to fabricate damascene interconnects is shown in FIGS. 2A through 2F, which illustrate various process steps in the present invention by showing the cross-sections of the resulting structures after each process step. As the invention's first step in fabricating damascene interconnects, FIG. 2A shows a cross-section of a first dielectric material, referred to as "inter-layer dielectric" ("ILD") 202 in the present application. Inter-layer dielectric 202 is formed on substrate 204. Substrate 204 usually contains circuitry and may contain other interconnection levels.

One of the considerations in the choice of which material to utilize for inter-layer dielectric 202 is the material's dielectric constant. For the reasons discussed above, it is advantageous to have a low-k material. Another consideration is the vulnerability of inter-layer dielectric 202 to the chemistry used during the CMP process, as discussed further below. It is noted that the phrases "low-k material" and "low-k dielectric" refer to material or dielectric having a dielectric constant lower than the dielectric constant of silicon oxide. In the present application, inter-layer dielectric 202 is also referred to as a first dielectric.

Figure 2B:
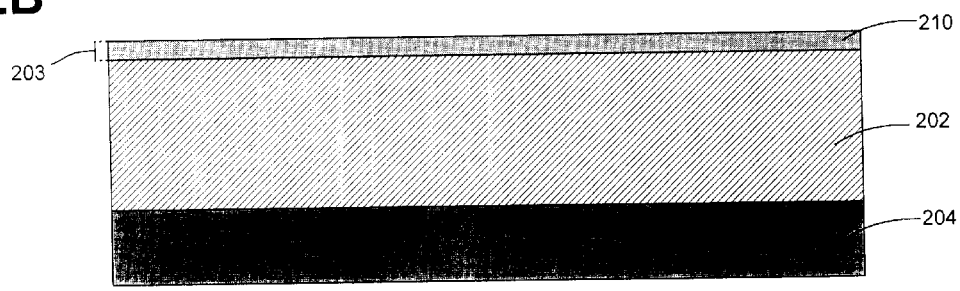
FIG. 2B shows a cross-section of the result of a step according to the invention where a sacrificial layer is formed over the low-k dielectric.

FIG. 2B shows a cross-section of the result of the next step in the invention's process for fabricating damascene interconnects. As shown in FIG. 2B, a second low-k dielectric material blankets the top surface of inter-layer dielectric 202. This blanket of second dielectric material is referred to as "sacrificial layer" 210 in the present application. In the present application, sacrificial layer 210 is also referred to as a second dielectric. Sacrificial layer 210 has different physical properties than inter-layer dielectric 202, as discussed further below. Sacrificial layer 210 can be deposited over inter-layer dielectric 202 by using known deposition methods such as chemical vapor deposition ("CVD"). The thickness of sacrificial layer 210 in the present embodiment of the invention is approximately 0.1 microns and is referred to in FIG. 2B by numeral 203.

Figure 2C:
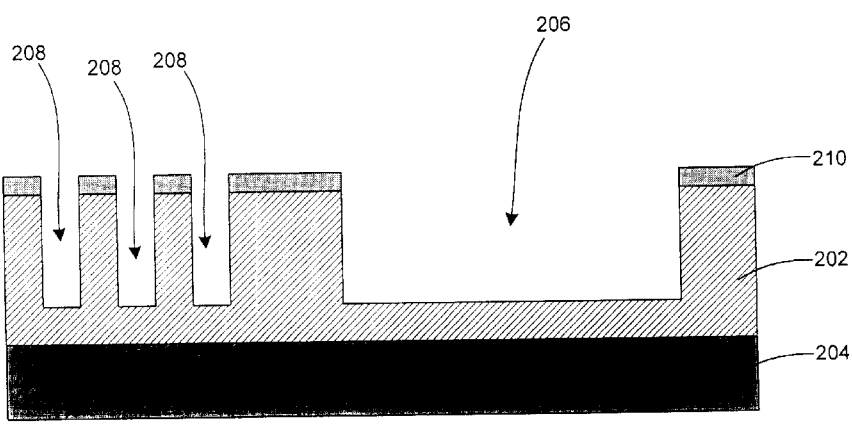
FIG. 2C shows a cross-section of the result of a step according to the invention where trenches are etched in the sacrificial layer and the low-k dielectric.

FIG. 2C shows a cross-section of the result of the next step in the invention's process for fabricating damascene interconnects. As shown in FIG. 2C, four trenches have been etched in sacrificial layer 210 and inter-layer dielectric 202. A wide trench referred to by numeral 206 and three narrow trenches referred to by numeral 208. These trenches are formed by removing selected portions of layers 210 and 202 using a suitable anisotropic etch technique, such as reactive ion etching, as known in the art.

Figure 2D:
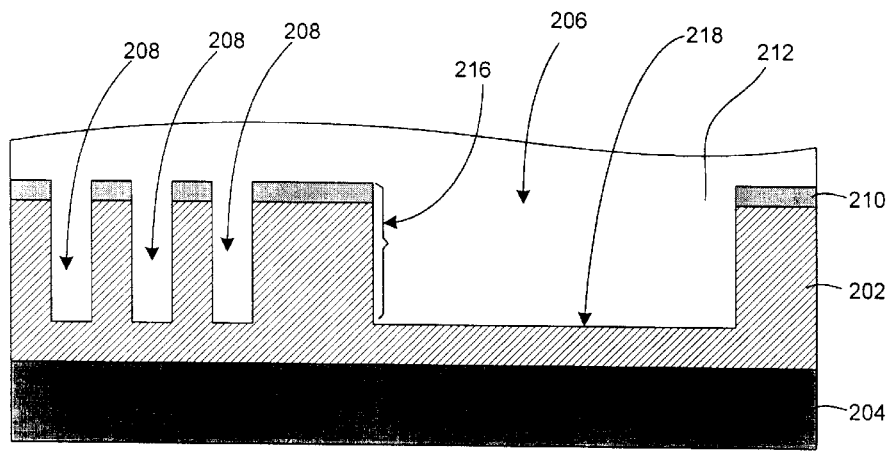
FIG. 2D shows a cross-section of the result of a step according to the invention where metal is deposited over the trenches etched in the sacrificial layer and the low-k dielectric.

FIG. 2D shows a cross-section of the result of the next step in the invention's process for fabricating damascene interconnects. As shown in FIG. 2D, copper film 212 is shown as having been deposited over sacrificial layer 210 and over inter-layer dielectric 202. Although not shown in any of the FIGURES, prior to deposition of copper film 212, a metal barrier layer such as tantalum (Ta) or tantalum nitride (TaN) and a copper seed layer are deposited over inter-layer dielectric 202. Copper film 212 is then electroplated over the tantalum (Ta) or tantalum nitride (TaN) barrier layer and over the copper seed layer. Preferably, copper film 212 is formed to a depth such that narrow trenches 208 and wide trench 206 are completely filled with copper. The copper film deposited inside wide trench 206 or narrow trenches 208 is also referred to as the "metal filling" in the present application. As shown in FIG. 2D, each trench such as trench 206 and trenches 208, has a trench side wall such as side wall 216 of wide trench 206. Each trench side wall in FIG. 2D consists of a lower part which is made of inter-layer dielectric 202 and an upper part which is made of sacrificial layer 210. Moreover, each trench has a bottom, such as bottom 218 of wide trench 206, which is made entirely of inter-layer dielectric 202.

Figure 2E:
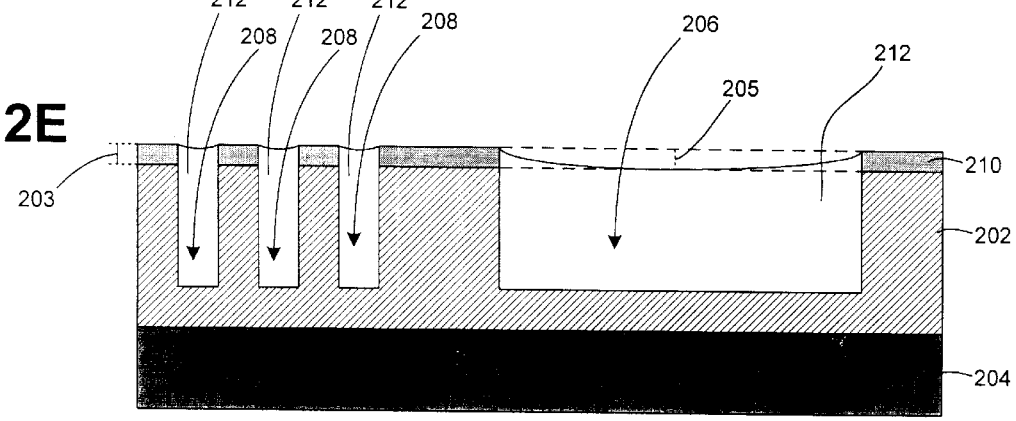
FIG. 2E shows a cross-section of the result of a step according to the invention where a first CMP process is performed to remove excess metal over the sacrificial layer.

The unwanted portions of copper film 212, i.e. the portion that is shown above sacrificial layer 210, must be removed. FIG. 2E shows a cross-section of the result of the next step in the invention's process for fabricating damascene interconnects. As shown in FIG. 2E, the unwanted portions (i.e. excess portions) of the copper have been removed by a first chemical mechanical polish, also referred to as "first CMP" in the present application. As shown in FIG. 2E, sacrificial layer 210 has not been removed by the first CMP. The present invention's method achieves this result of selectively removing the unwanted copper and not the sacrificial layer 210 by utilizing a CMP chemistry for the first CMP that is designed not to remove sacrificial layer 210, but to remove unwanted copper film 212. A slurry providing both abrasive and chemically reactive components is supplied, typically to the pad, during CMP polishing.

In the present embodiment, sacrificial layer 210 can be a material such as undoped silicon oxide deposited by a CVD process. In an alternative embodiment, sacrificial layer 210 can be a "quasi-inorganic material" such as HOSP with carbon which is deposited by a spin on process. In the present application, the step of fabricating sacrificial layer 210 is generally referred to as a step of forming the sacrificial layer which does not necessarily need to be formed by a deposition technique. When sacrificial layer 210 is undoped silicon oxide, a typical first CMP slurry would comprise approximately 3.0% to 4.0% peroxide and 1.0% silica particles. This is a conventional CMP slurry and is known in the art. The peroxide selectively oxidizes copper film 212. The peroxide does not oxidize sacrificial layer 210. The silica particles, in turn, provide the abrasive mechanism to start removing the oxidized copper.

Referring again to FIG. 2E, it is shown that the first CMP has resulted in copper dishing of wide trench 206 and narrow trenches 208. The copper dishing is much greater in wide trench 206 than in narrow trenches 208 and is generally more pronounced in larger features on the wafer surface. It can be seen in FIG. 2E that the "copper dishing depth" of wide trench 206, referred to by numeral 205, is approximately equal to thickness 203 of sacrificial layer 210, which is approximately 0.1 microns in the present embodiment.

The present invention's method selects thickness 203 of sacrificial layer 210 to be approximately the same as the depth of copper dishing that is expected to result from the first CMP process. Thickness 203 of sacrificial layer 210 also accommodates the worst-case dielectric erosion effects which are seen in dense narrow trench arrays (not shown in any of the FIGURES). Thus, the thickness of sacrificial layer 210 is chosen to counteract the copper dishing and dielectric erosion effects of the first CMP.

Figure 2F:
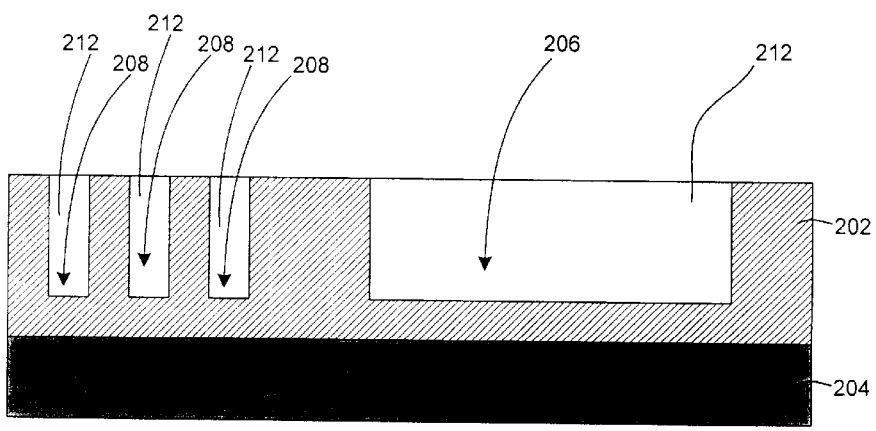
FIG. 2F shows a cross-section of the result of a step according to the invention where a second CMP process is performed to remove the sacrificial layer over the low-k dielectric and to remove any remaining excess metal.

FIG. 2F shows a cross-section of the result of the final step in the invention's process for fabricating damascene interconnects. As shown in FIG. 2F, sacrificial layer 210 has been removed by a second chemical mechanical polish, also referred to as a "second CMP" in the present application. Along with sacrificial layer 210, the remaining portion of copper film 212 over inter-layer dielectric 202 is also removed during the second CMP. The surface of copper film 212 is now substantially flush with the surface of inter-layer dielectric 202 and has a uniform thickness across the surface of the wafer. There is no significant copper dishing or dielectric erosion on wide trench 206 or on narrow trenches 208.

The present invention's method achieves uniform thickness of copper film 212 by utilizing a CMP slurry for the second CMP which is designed to remove sacrificial layer 210, but to stop removing material when inter-layer dielectric 202 is reached. In the embodiment where sacrificial layer 210 is undoped silicon oxide, a typical second CMP slurry would comprise 0.1% to 0.3% peroxide and 10.0% to 12.0% silica particles. The silica particle concentration is increased to make the second CMP slurry more abrasive. More abrasion is needed to remove sacrificial layer 210, which is undoped silicon oxide in the present embodiment, than was needed to remove only copper film 212 during the first CMP. At the same time, the peroxide and the pressure exerted by the second CMP polishing removes the remaining portions of copper film 212 over inter-layer dielectric 202. The second CMP would be a timed or incremental step. The length of time or the size of increment of the second CMP would be adjusted to remove sacrificial layer 210, which in the present embodiment has a depth of 0.1 microns. Any of the steps of the first CMP process, the second CMP process, or both the first and second CMP process steps combined, is also referred to in the present application as a "planarizing step."

As discussed above, inter-layer dielectric 202 is chosen not only for its low-k characteristics, but also based on its ability to act as a "stop layer" to the second CMP chemistry and process. Its physical characteristics must be such that it differs from the dielectric used as sacrificial layer 210, which is undoped silicon oxide in the present embodiment. Inter-layer dielectric 202 must be essentially inert to the second CMP slurry chemistry. In this way inter-layer dielectric 202 will act as a stop layer. Based on the thickness chosen for inter-layer dielectric 202, a more uniform thickness of copper film 212 is attained across the wafer. In the present embodiment, inter-layer dielectric 202 can be an organic low-k material known in the art as FLARE™ manufactured by Honeywell, Inc. Alternatively, another organic low-k material known in the art as SiLK™ manufactured by Dow Chemical, Inc. may be used.

Thus it is seen that the present embodiment of the invention discloses an improved method for fabrication of damascene interconnects in integrated circuits. The advantages of using the damascene process, such as the reduction in interconnect delay derived from the lower resistivity of copper and the use of low-k dielectric materials is maintained, while the disadvantages of the damascene process, such as copper dishing and dielectric erosion are effectively controlled.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. For example, although in the above discussions copper was used as a metal for filling the trenches shown in the various FIGURES of the present application, aluminum could be used instead of copper without departing from the scope of the present invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, method for fabrication of damascene interconnects and related structures has been described.

What is claimed is:

1. A method comprising steps of:

forming a sacrificial layer over a dielectric;

etching a trench in said sacrificial layer and said dielectric;

depositing metal in said trench;

removing excess metal utilizing a first CMP slurry;

removing said sacrificial layer using a second CMP slurry.

2. The method of claim 1 wherein said metal is substantially planarized relative to said dielectric during said step of removing said sacrificial layer.

3. The method of claim 1 wherein said dielectric has a dielectric constant lower than a dielectric constant of silicon.

4. The method of claim 1 wherein said dielectric is substantially inert to said second CMP slurry.

5. The method of claim 1 wherein said metal is selected from the group consisting of copper and aluminum.

6. The method of claim 1 wherein said sacrificial layer comprises HOSP.

7. The method of claim 1 wherein said sacrificial layer comprises undoped silicon oxide.

8. The method of claim 7 wherein said first CMP slurry comprises approximately 3.0% to approximately 4.0% peroxide and approximately 1.0% silica particles.

9. The method of claim 7 wherein said second CMP slurry comprises approximately 0.1% to approximately 0.3% peroxide and approximately 10.0% to approximately 12.0% silica particles.

10. The method of claim 1 wherein said dielectric comprises an organic low-k material.

11. The method of claim 10 wherein said organic low-k material is selected from the group consisting of FLARE and SiLK.

* * * * *